United States Patent
Cooper et al.

(10) Patent No.: US 10,374,000 B2
(45) Date of Patent: Aug. 6, 2019

(54) THERMAL-CONTRACTION MATCHED HYBRID DEVICE PACKAGE

(71) Applicant: TELEDYNE SCIENTIFIC & IMAGING, LLC, Thousand Oaks, CA (US)

(72) Inventors: Donald E. Cooper, Moorpark, CA (US); Lisa L. Fischer, Ventura, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 694 days.

(21) Appl. No.: 14/034,306

(22) Filed: Sep. 23, 2013

(65) Prior Publication Data

US 2015/0083892 A1 Mar. 26, 2015

(51) Int. Cl.
*H01L 27/146* (2006.01)

(52) U.S. Cl.
CPC .... *H01L 27/1465* (2013.01); *H01L 27/14618* (2013.01); *H01L 2224/48091* (2013.01); *H01L 2224/73265* (2013.01)

(58) Field of Classification Search
CPC ...... H05K 1/02; H05K 1/0201; H05K 1/0212; H01L 27/14634; H01L 23/28
See application file for complete search history.

(56) References Cited

U.S. PATENT DOCUMENTS

| | | | |
|---|---|---|---|
| 5,232,766 A | 8/1993 | Tokunaga | 428/209 |
| 5,308,980 A | 5/1994 | Barton | 250/338.4 |
| 5,585,624 A | 12/1996 | Asatourian et al. | 250/216 |
| 5,600,140 A | 2/1997 | Asatourian | 250/332 |
| 5,672,545 A * | 9/1997 | Trautt | G01L 5/0047 257/E21.511 |
| 5,714,760 A | 2/1998 | Asatourian | 250/352 |
| 5,959,340 A | 9/1999 | Wan et al. | 257/443 |
| 6,127,203 A | 10/2000 | Wan et al. | 438/67 |
| 7,645,686 B2 | 1/2010 | Fendler et al. | 438/464 |
| 2005/0006829 A1 * | 1/2005 | Chow | F16F 1/027 267/74 |
| 2007/0148807 A1 * | 6/2007 | Akram | H01L 27/14618 438/65 |

* cited by examiner

*Primary Examiner* — Georgia Y Epps
*Assistant Examiner* — Don Williams
(74) *Attorney, Agent, or Firm* — Koppel, Patrick, Heybi & Philpott

(57) ABSTRACT

A hybrid device package comprising a baseplate, a balanced composite structure (BCS) on the baseplate, a first IC on the BCS, and at least one additional IC physically coupled to the first IC. The coefficient of thermal expansion (CTE) for the stack formed from the BCS and the first IC is arranged to be approximately equal to that of the baseplate, thereby reducing the thermal stress to which the at least one additional IC is subjected when cooled to its operating temperature which might otherwise result in physical damage to the IC. The baseplate is preferably an alumina ceramic baseplate. In one embodiment, the first IC is a readout IC (ROIC), the at least one additional IC is a detector array IC which is on the ROIC, and the hybrid device package is a focal plane array (FPA).

15 Claims, 2 Drawing Sheets

THERMAL-CONTRACTION MATCHED HYBRID DEVICE PACKAGE

GOVERNMENT LICENSE RIGHTS

This invention was made with government support under Contract No. NAS5-01091/IR H4RG-10 Sensor Chip Assemblies for NASA, awarded by NASA. The government has certain rights in the invention.

BACKGROUND OF THE INVENTION

Field of the Invention

This invention relates to the field of hybrid devices, and more particularly to low thermal stress hybrid device packages.

Description of the Related Art

A hybrid device is an electronic component which typically includes two or more distinct electronic components, such as integrated circuits (ICs), housed within a common package. One example is a detector array device, which would typically include a detector array IC and a readout IC (ROIC), housed in a common package which provides an electrical interface to the ICs.

The various components making up a hybrid device package typically have different coefficients of thermal expansion (CTEs). A hybrid device such as a detector array is generally operated at a very low operating temperature. Thus, as the device is cooled from room temperature to operating temperature, the result is thermal stress. If the stresses are unbalanced, the structure may 'bow'. Bowing is undesirable for an optical sensor because it causes the sensor elements to deviate from a perfect plane, thus making it more difficult to precisely focus an optical image on the sensor. Bowing also produces large shear strains in the detector array IC, which facilitates defect nucleation and growth which degrade detector performance.

There is typically a substantial mismatch between the CTE of the detector and the ROIC, with the detector having a higher CTE than the ROIC. If this is not mitigated, then upon cooling the detector is under tensile stress, and 'channel cracking' can occur which can significantly degrade device performance. This tends to occur at temperatures below which the energy released in the mechanical relaxation of the stressed film is greater than the surface energy of the newly-formed crack surface.

One possible hybrid device package embodiment is shown in FIG. 1. The package 10 includes an IC 12, such as a detector array IC (or simply, "detector"), mounted on a readout IC (ROIC) 14, which is in turn mounted on a "balanced composite structure" (BCS) 16 which includes a balancing layer 18 and a compressive layer 20. The BCS is mounted to a baseplate 22, to which an electrical interface board 24 is also mounted. Electrical connections between ROIC 14 and board 24 would typically be effected with wire bonds 26.

In an effort to reduce thermal stresses, the CTE values of baseplate 22 (suitably molybdenum), BCS/ROIC stack 16/14 and IC 12 are preferably matched. This reduces the stress on the detector by compressing the ROIC to match the thermal contraction of the detector. However, the CTE of electrical interface board 24, typically made from a ceramic or polymer material, is likely to be different from that of the baseplate, BCS and IC 12. This mismatch can lead to stress on and/or the bowing of the device structure (if board 24 and baseplate 22 are rigidly bonded together), or relative motion between the board and the baseplate (if the board is mounted to the baseplate such that it can move with respect to the baseplate) as the device is cooled.

Another possible hybrid device package is shown in FIG. 2. Here, the package 30 includes an IC 32 such as a detector array IC. In this example, IC 32 has had its substrate removed and is mounted on a readout IC (ROIC) 34, which is in turn mounted on a baseplate 36, suitably silicon carbide (SiC) or Invar. An electrical interface board 38 is also mounted on baseplate 36, with electrical connections between the ROIC and board typically effected with wire bonds 40.

In this design the CTE of baseplate 36 is preferably matched to that of ROIC 34, which reduces the stress on the ROIC. However, all the thermal mismatch stress is then concentrated in the thin detector film. Since the detector layer is much thinner than the ROIC and substrate there is very little bowing, but the high tensile stress can result in channel cracking of the detector. The CTE of the baseplate is also likely to be different from that of the electrical interface board 38, which can lead to bowing of the assembly.

SUMMARY OF THE INVENTION

A hybrid device package is presented which mitigates some of the problems discussed above, providing a package design which reduces thermal deformation as the package is cooled, and reduces thermal stress below the threshold at which channel cracking can occur. In one embodiment, the CTE of a BCS is designed to match that of an alumina baseplate, which compresses the ROIC less than a BCS that is CTE-matched to the detector. Thus there is still a residual mismatch between the ROIC and the detector, but the resulting stress is low enough that the detector will not crack.

The present hybrid device package comprises a baseplate, a balanced composite structure (BCS) on the baseplate, a first IC on the BCS, and at least one additional IC physically coupled to the first IC, with the at least one additional IC having an associated operating temperature. The hybrid device package is arranged such that the CTE of the "stack" that includes the BCS and the first IC is approximately equal to that of the baseplate, thereby reducing the thermal stress to which the at least one additional IC is subjected when cooled to its operating temperature which might otherwise result in physical damage to the at least one additional IC.

The baseplate may further comprise an electrical interface board to which the first and additional ICs can be electrically connected, with the electrical interface board preferably forming a portion of a monolithic structure with the baseplate.

The baseplate is preferably an alumina ceramic baseplate. The thickness of the BCS balancing layer is preferably approximately equal to that of the first IC, and both preferably comprise a common material such as silicon. In one embodiment, the first IC is a readout IC (ROIC), the at least one additional IC is a substrate-removed detector array IC which is on the ROIC, and the hybrid device package is a focal plane array (FPA).

Further features and advantages of the invention will be apparent to those skilled in the art from the following detailed description, taken together with the accompanying drawings.

DETAILED DESCRIPTION OF THE INVENTION

Figure 3:
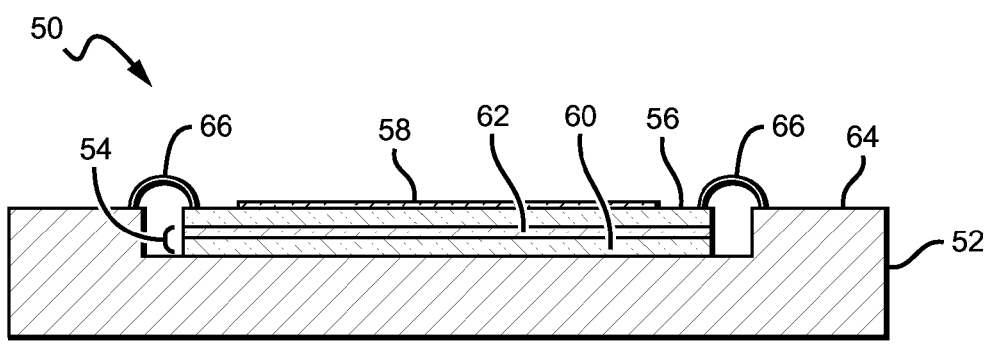
FIG. 3 is a sectional view of a hybrid device package in accordance with the present invention.

One possible embodiment of a hybrid device package 50 in accordance with the present invention is shown in FIG. 3. The package preferably includes a baseplate 52, with a balanced composite structure (BCS) 54 on the baseplate. A first IC 56 is on the BCS, and at least one additional IC 58 is physically coupled to the first IC. The at least one additional IC 58 has an associated operating temperature; if IC 58 is a detector array IC, it would typically have to be cooled to a very low temperature (on the order of −200° C.) to reach its operating temperature.

The cooling process can cause problems for the hybrid device, due to the different coefficients of thermal expansion (CTEs) associated with the various device components. For example, CTE mismatches between the components can cause first IC 56 to bow, which can cause several types of damage to additional IC 58. For example, electrical interconnections between ICs 56 and 58 can fail or become unreliable due to the bowing. In addition, bowing-induced tensile stress on IC 58 can result in 'channel cracking' as described above.

One possible application for the present hybrid device package is a focal plane array (FPA). Here, ICs 56 and 58 are a ROIC and a detector array IC (preferably with its substrate removed), respectively. A flat, unbowed assembly is desirable for a FPA in order that the array of detectors remain in a plane, allowing precise focus. This goal is difficult or impossible to achieve if mismatched CTE values result in bowing of the ROIC to which the detector array IC is coupled.

The present hybrid device package mitigates these bowing-related problems. Hybrid device package 50 is arranged such that the coefficient of thermal expansion (CTE) for the component "stack" that includes BCS 54 and first IC 56 is approximately equal to that of baseplate 52. For a substrate-removed detector, the CTE mismatch with the detector does not contribute to the bowing, as the very thin detector is not a significant structural element. Thus, this design will remain flat as the temperature is varied.

In a preferred embodiment, baseplate 52 comprises alumina, with the baseplate preferably being an alumina ceramic baseplate. Alumina is preferred due to the fact that it is a common packaging material, and the electrical interface board (discussed below) can be incorporated into the baseplate with standard manufacturing techniques.

BCS 54 preferably comprises a balancing layer 60 on baseplate 52, and a compressive layer 62 on the balancing layer. As noted above, a BCS is generally designed to reduce the thermal stress on IC 58 by compressing IC 56. Balancing layer 60 has a thickness which is preferably approximately equal to that of first IC 56, and IC 56 and balancing layer 60 preferably comprise a common material. Assume, for example, that IC 56 is a readout IC (ROIC) fabricated on silicon (Si). Then, balancing layer 60 preferably comprises Si and has a thickness approximately equal to that of the ROIC.

The present hybrid device package is well-suited for use with a focal plane array (FPA) device. The preferred package structure includes an alumina ceramic baseplate 52, a BCS 54 on the baseplate, a ROIC 56 on the BCS, and a detector array IC 58 on the ROIC. The detector array IC suitably comprises an array of HgCdTe photodetectors. The CTE values associated with baseplate 52 and the BCS/ROIC stack (54/56) are arranged to be approximately equal, thereby reducing or eliminating bowing of the assembly.

As the baseplate is not necessarily CTE-matched to the detector array IC, the detector will still be under tensile stress. However, the amount of stress will be considerably less than that associated with a non-BCS package design or other known designs. The detector can function well under tensile stress, but as the stress exceeds the threshold for channel crack formation, and cracks propagate in the detector, those detector elements (pixels) that are cracked become inoperable. To eliminate channel cracking, it is not necessary to eliminate the tensile stress on the detector; rather, the stress must be reduced below the threshold for channel crack formation. The present package can eliminate channel cracking for an implementation consisting of a substrate-removed HgCdTe detector array on a BCS matched to an alumina substrate.

If the hybrid device package is a FPA as defined above, it is preferable that detector array IC 58 have its substrate removed, such as by grinding and/or etching. This tends to improve the detector's performance, as the presence of a substrate can act to degrade performance when exposed to cosmic rays, or as a result of a poor detector/substrate interface. A detector array IC with its substrate removed is also preferred because an IC so thinned is less susceptible to channel cracking than a thicker detector array IC with a full substrate.

Baseplate 52 may further comprise an electrical interface board 64 to which first IC 56 and the additional ICs can be electrically connected; one interconnection means could be wire bonds 66, as shown in FIG. 3. An advantage of using an alumina ceramic baseplate is that doing so enables electrical interface board 64 to be a part of the baseplate; i.e., the baseplate and electrical interface board may be formed as a monolithic structure. This serves to ensure that the CTEs of the baseplate and electrical interface board are approximately matched, which also helps to reduce the thermal stress on IC 58.

Having the BCS/ROIC stack (54/56) be CTE-matched to baseplate 52 serves to reduce thermal deformation as the hybrid device is cooled to its operating temperature. The BCS further acts to partially relieve thermal stress on IC 58. When IC 58 is a detector, the described technique can reduce or eliminate channel cracking of the detector. Thus, the present hybrid device package addresses both the bowing and channel cracking problems known in the prior art.

Another advantage of the present package is that the package parts count can be reduced in comparison with prior art designs. This may be accomplished by incorporating electrical interface board 64 into the alumina ceramic baseplate 52 as described above, such that a monolithic structure is formed.

Figure 1:
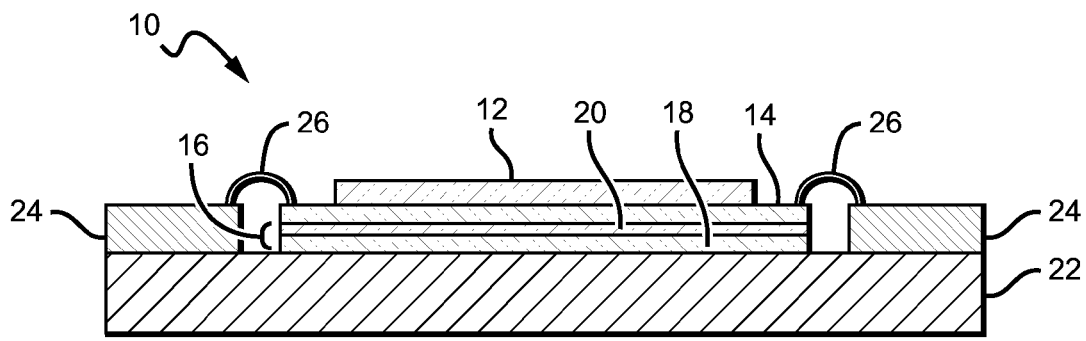
FIG. 1 is a sectional view of a known hybrid device package.
Figure 2:
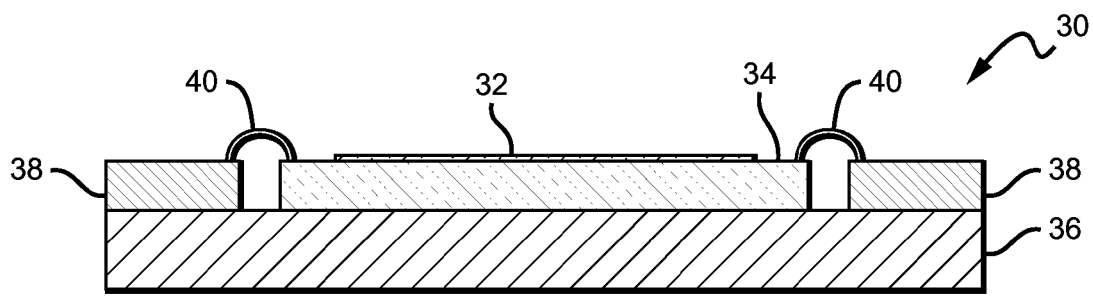
FIG. 2 is a sectional view of a known hybrid device package.
Figure 4:
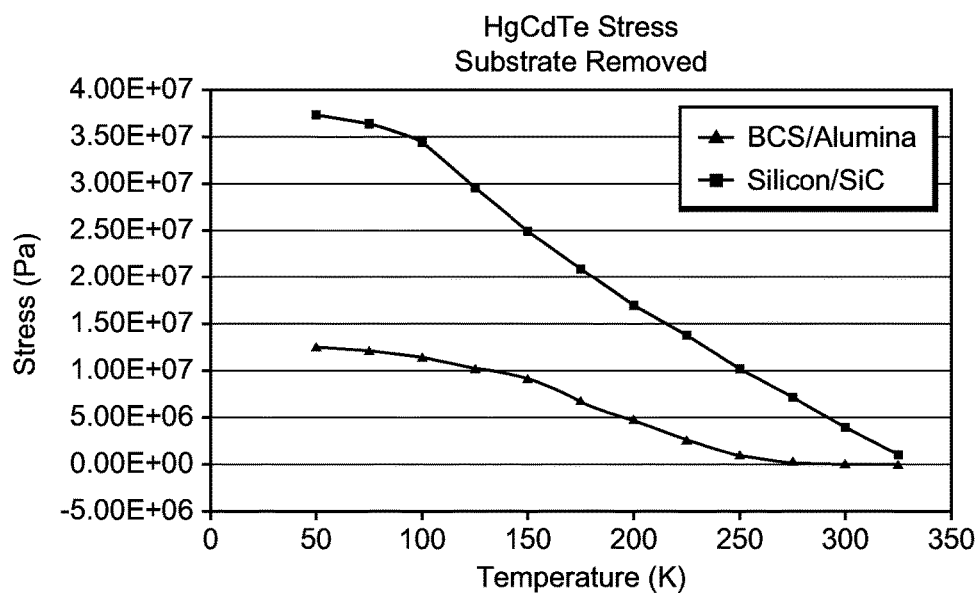
FIG. 4 is a graph comparing detector array IC stress for a hybrid device package in accordance with the present invention ("BCS/Alumina") with a prior art hybrid device package ("Silicon/SiC").

The reduction of stress on a detector array IC (e.g., a HgCdTe detector with substrate removed) that may be achieved by the present package is illustrated in FIG. 4, which depicts stress with respect to temperature for both a known package such as that shown in FIG. 2 (with a silicon ROIC on a SiC baseplate) and an embodiment of the present package (with an alumina baseplate CTE-matched to a BCS/ROIC stack). The reduction in stress is readily apparent, with the reduction in stress level increasing as the temperature falls toward the typical detector array IC operating temperature.

Figure 5:
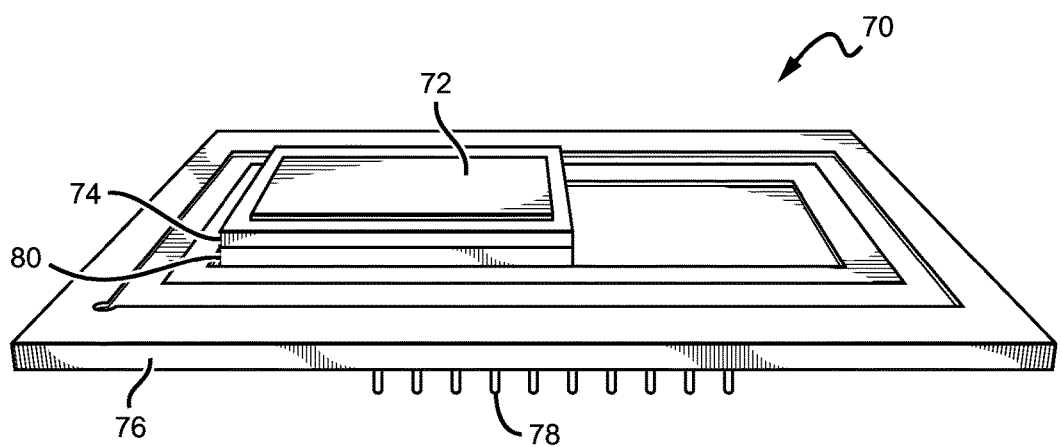
FIG. 5 is a perspective view photograph of a hybrid device package in accordance with the present invention.

A perspective view of one possible embodiment of a hybrid device package as described herein is shown in FIG. 5. Here, the package 70 includes a detector array IC 72 which resides on a ROIC (not visible below detector). The ROIC is positioned on a BCS 74, which in turns resides on an alumina ceramic baseplate 76. Baseplate 76 further includes an integrated electrical interface to both the ROIC and to a system socket (via pins 78 for this embodiment, though numerous other electrical interface means are contemplated). The package may further include a shim 80, preferably alumina when the baseplate is alumina, between baseplate 76 and BCS 74. Such a shim is not essential, but may be beneficial for the purpose of controlling the location of the detector image plane.

As noted above, the present hybrid device package requires that the CTE of the BCS/ROIC be approximately equal to that of the baseplate. This objective can be achieved in any of a number of ways. One possible approach is to control the thicknesses of the ROIC, BCS compressive layer and BCS balancing layer such that the thermal contraction of the BCS/ROIC stack matches that of the alumina baseplate.

Determining the appropriate thicknesses may be accomplished analytically, empirically, or some combination of both. The CTEs of a first IC, a BCS, and a baseplate can all be calculated by known means, with the various thicknesses adjusted as needed to achieve the required CTE matching. The calculations are preferably optimized for best thermal matching at the device's operating temperature, to prevent extended periods of marginal shear stress.

The thicknesses of the layers of the ROIC/BCS stack are related to the composite CTE ($\alpha_c$) of the stack as follows:

$$t_1 = \frac{2E_2 t_2 (\alpha_2 - \alpha_c) + E_3 t_3 (\alpha_3 - \alpha_c)}{2E_1 (\alpha_c - \alpha_1)},$$

where $\alpha_1$, $\alpha_2$, $\alpha_3$, $t_1$, $t_2$, $t_3$ and $E_1$, $E_2$, $E_3$ are the CTEs, thicknesses and moduli of the ROIC, BCS compressive and BCS balancing layers, respectively. The required layer thicknesses can be determined by setting the composite CTE $\alpha_c$ to that of the baseplate CTE to be matched, and then solving for the thicknesses.

While particular embodiments of the invention have been shown and described, numerous variations and alternate embodiments will occur to those skilled in the art. Accordingly, it is intended that the invention be limited only in terms of the appended claims.

We claim:

1. A hybrid device package, comprising:
   a baseplate;
   a balanced composite structure (BCS) comprising:
     a balancing layer;
     a first adhesive layer on said balancing layer;
     a compressive layer on said first adhesive layer; and
     a second adhesive layer on said compressive layer, said BCS, said baseplate;
   a first integrated circuit (IC) on said second adhesive layer, said first IC and said BCS forming a stack; and
   a detector array IC physically coupled to said first IC, said detector array IC having an associated operating temperature;
   said hybrid device package arranged such that the coefficient of thermal expansion (CTE) of said stack is approximately equal to that of said baseplate, thereby reducing the thermal stress to which said detector array IC is subjected when cooled to its operating temperature which might otherwise result in physical damage to said detector array IC.

2. The hybrid device package of claim 1, wherein said baseplate comprises alumina.

3. The hybrid device package of claim 2, wherein said baseplate is an alumina ceramic baseplate.

4. The hybrid device package of claim 1, wherein thickness of said balancing layer is approximately equal to that of said first IC.

5. The hybrid device package of claim 1, wherein said first IC and said balancing layer comprise a common material.

6. The hybrid device package of claim 5, wherein said common material is silicon.

7. The hybrid device package of claim 1, wherein said first IC is a readout IC (ROIC), said detector array IC is on said ROIC, and said hybrid device package is a focal plane array (FPA).

8. The hybrid device package of claim 7, wherein said detector array IC is directly on said ROIC.

9. The hybrid device package of claim 1, wherein said detector array IC comprises an array of HgCdTe photodetectors.

10. The hybrid device package of claim 1, wherein said baseplate further comprises an electrical interface board to which said first and said detector array ICs can be electrically connected, said electrical interface board forming a portion of a monolithic structure with said baseplate.

11. The hybrid device package of claim 1, said package arranged such that the thicknesses of the layers of said stack are related to the composite CTE ($\alpha_c$) of the stack as follows:

$$t_1 = \frac{2E_2 t_2 (\alpha_2 - \alpha_c) + E_3 t_3 (\alpha_3 - \alpha_c)}{2E_1 (\alpha_c - \alpha_1)},$$

where $\alpha_1$, $\alpha_2$, $\alpha_3$, $t_1$, $t_2$, $t_3$ and $E_1$, $E_2$, $E_3$ are the CTEs, thicknesses and moduli of the first IC, the adhesive layers joining the BCS to the first IC and the compressive layer of the BCS to the balancing layer of the BCS, and the BCS compressive layer, respectively.

12. A hybrid focal plane array (FPA) device package, comprising:
   a baseplate comprising alumina;
   a balanced composite structure (BCS) in direct contact with said baseplate, said BCS consisting of:
     a balancing layer on said baseplate;
     a first adhesive layer on said balancing layer;
     a compressive layer on said first adhesive layer; and
     a second adhesive layer on said compressive layer,
   a readout integrated circuit (ROIC) on said second adhesive layer, said BCS and said ROIC forming a BCS/ROIC stack;
   a detector array IC physically coupled to said ROIC, said detector array IC having an associated operating temperature; and
   an electrical interface board to which said ROIC and said detector IC can be electrically connected, said electrical interface board forming a portion of a monolithic structure with said baseplate;

said FPA device package arranged such that the coefficient of thermal expansion (CTE) of said BCS/ROIC stack is approximately equal to that of said baseplate, thereby reducing the thermal stress to which said detector array IC is subjected when cooled to its operating temperature which might otherwise result in physical damage to said detector array IC.

13. The hybrid FPA device package of claim 12, wherein the thickness of said balancing layer is approximately equal to that of said ROIC and wherein said ROIC and said balancing layer comprise a common material.

14. The hybrid FPA device package of claim 12, wherein said detector array IC is directly on said ROIC.

15. The hybrid FPA device package of claim 12, wherein said detector array IC comprises an array of HgCdTe photodetectors.

\* \* \* \* \*